United States Patent [19]

Anstey

[11] Patent Number: 4,991,927

[45] Date of Patent: Feb. 12, 1991

[54] INTERCONNECTION SYSTEMS FOR ELECTRICAL CIRCUITS

[75] Inventor: Michael J. Anstey, Wokingham, England

[73] Assignee: Dowty Electronic Components Limited, Buckinghamshire, England

[21] Appl. No.: 390,180

[22] Filed: Aug. 7, 1989

Related U.S. Application Data

[63] Continuation-in-part of Ser. No. 123,160, Nov. 23, 1987, Pat. No. 4,872,841.

[51] Int. Cl.$^5$ .............................................. G02B 6/42
[52] U.S. Cl. .............................. 350/96.20; 350/96.21; 350/96.22
[58] Field of Search ............... 350/96.20, 96.21, 96.22

[56] References Cited

U.S. PATENT DOCUMENTS

4,872,843  10/1989  Anstey .................................. 439/69

FOREIGN PATENT DOCUMENTS

2095039A  9/1982  United Kingdom .
2127217A  4/1984  United Kingdom .

Primary Examiner—John D. Lee
Assistant Examiner—Phan T. Heartney
Attorney, Agent, or Firm—Leydig, Voit & Mayer

[57] ABSTRACT

Electrical circuits can be built up in three dimensions by using spacers which interlock together to define stacks. Stacks can be used to clamp together chip carriers between adjacent spacers or to provide power and signal transmission stacks which have a number of continuous tracks. Link members are used to provide electrical connection means between the chip carriers in the chip carrier stacks and the tracks of the power and signal transmission stacks.

5 Claims, 4 Drawing Sheets

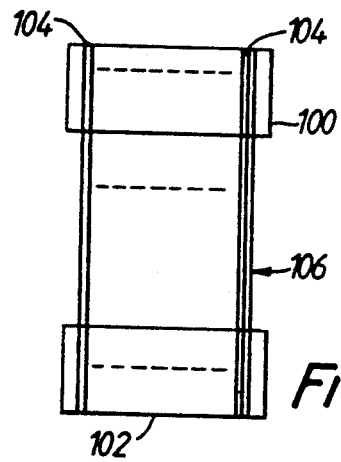 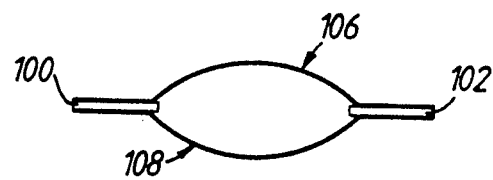
FIG. 10.  FIG. 11.
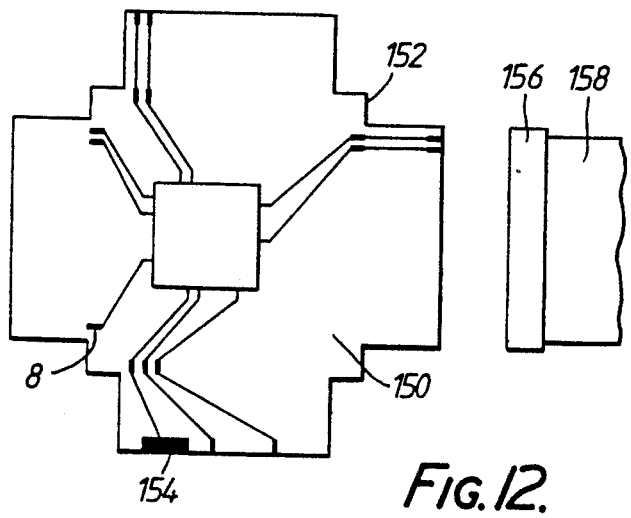
FIG. 12.
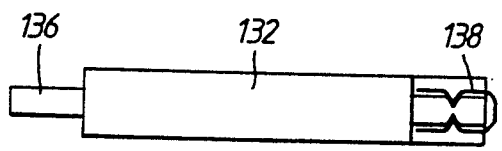
FIG. 13.
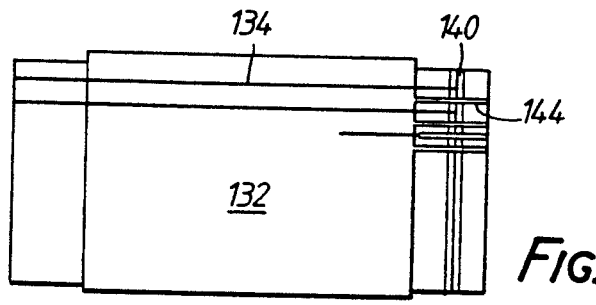
FIG. 14.

INTERCONNECTION SYSTEMS FOR ELECTRICAL CIRCUITS

CROSS REFERENCE TO RELATED APPLICATIONS

This application is a continuation of Anstey U.S. application Ser. No. 123,160, filed Nov. 23, 1987, now U.S. Pat. No. 4,872,841.

The present invention relates to interconnection systems for electrical circuits and, more particularly, to systems which enable electrical circuits to be laid out in three dimensions.

BACKGROUND OF THE INVENTION

GB-B-2 095 039 and -2 127 217 both describe assemblies for connecting together a number of electrical component packages which carry electrical circuit components. Since these electrical circuit components are normally semiconductor chips, these packages, which typically, but not necessarily, carry only a single chip, will be referred to herein as "chip carriers". In both these references, electrical interconnections between the chip carriers are made by mounting the carriers into a rack which also acts as the support structure. It is also proposed in GB-B-2 127 217 to provide electrical connections between adjacent chip carriers by means of a spacer element mounted between each adjacent pair of chip carriers. Such a spacer element does not, however, provide mechanical support for the assembly of chip carriers, and an external rack or similar is still required. The use of a rack, which is typically fabricated from strips of material of a predetermined length, restricts the number of chip carriers which can be assembled together, and therefore the overall size of a circuit which can be produced using this existing system.

GB-A-2 145 571 describes a system for stacking together printed circuit boards separated by spacer elements. It is proposed to hold the stack together by adhesives clipping or by the use of an external framework. It is stated in this reference that for stability reasons the maximum length of a stack produced with this system may be limited to as little as twice the largest dimension of the board. This therefore limits the size of circuit that can be constructed with this system.

Another technical problem associated with the use of a rack or spacer elements to connect a number of chip carriers, is that all the power and signal connections for each carrier must be passed across each preceding chip carrier. Since all the chip carriers will draw some power from the power line, there will be a resultant loss in the potential available for the chip carriers most remote from the source of power, possibly leading to a failure of the electrical components on the chip carriers to operate correctly. In the case of signals which must be passed from a chip on one carrier to a chip which is not directly adjacent, or which must be passed to several such chips, the level of the signal can be reduced in its transition across each chip carrier, again leading to possible failures of the circuit to operate correctly.

SUMMARY OF THE INVENTION

The technical problem underlying the present invention is that of providing a versatile system of interconnecting a large number of chip carriers in conjunction with providing a mechanism within such a system of distributing power and signals to individual carriers without incurring unacceptable levels of power or signal level loss.

The present invention accordingly provides an interconnection system comprising a plurality of stackable spacers each having means for mechanically interlocking with adjacent spacers in order to define an elongate stack in which apertures are defined through the faces thereof between adjacent spacers.

These spacers can be adapted to form stacks in which chip carriers are clamped between adjacent spacers, and wherein portions of the spacer defining edges of the apertures are provided with electrical connection means for co-operating with corresponding electrical connection means on the chip carriers. Preferably such spacers are frame shaped rectangular members with side portions, the upper and lower surfaces of which are adapted to define, together with respective facing surfaces of a side portion of an adjacent carrier, the edges of an aperture through each of the four faces of the stack between each adjacent pair of spacers, chip carriers being clampable between the side portions of adjacent spacers.

In order to provide for power and signal transmission, spacers are used which have a plurality of track sections adapted to interconnect electrically with corresponding track sections on an adjacent spacer in order to define a corresponding plurality of electrically continuous tracks along a stack of such carriers, each spacer further having a respective tapping conductor defined between each said track section and a surface defining an edge of an aperture.

Such spacers can be built up into independent power and signal transmission stacks which can co-operate at any level with the chip carrying stacks by means of link members which have spaced electrical connection means which co-operate with electrical connection means on the chip carrier directly or via electrical connection means provided in portions of the spacer defining edges of the apertures, the link member further comprising means for electrically connecting the spaced electrical connection means of the link member.

With spacers as defined above and a collection of appropriate flexible or rigid link members, a three dimensional circuit can be built up in which the electrical components mounted on the chip carriers are spatially interconnected in three dimensions Because of the use of independent stacks providing power and signal transmission tracks, which enable, via appropriate link members, power and signals to be brought in at any level of a chip carrier stack, there is effectively no limit to the size and configuration of a circuit which can be built up using chip spacers and link members.

In the context of this specification, the terms electrical connections means, electrically continuous conductor and the like will be used to embrace the transmission of electrical signals, whether as currents passing through metallic conductors, or as light signals conducted through optical fibres. For the purposes of clarity the embodiment to be described only refers to electrical conduction by the use of metallic tracks, but it will be appreciated that some or all of the signals may be carried by optical fibres.

A system of constructing electrical circuits using spacers and link members in accordance with the invention will now be described, by way of example only, with reference to the accompanying diagrammatic drawings, in which:

BRIEF DESCRIPTION OF THE DRAWINGS

FIG. 10 is a plan view of a first embodiment of a link member for interconnecting two stacks of spacers FIG. 11 is a side view of the link member of FIG. 10;

FIG. 12 is a plan view of a modified chip carrier for use with a second embodiment of a link member;

FIG. 13 is a side view of a third embodiment of a link member for interconnecting two adjacent stacks at the same level; and FIG. 14 is a plan view of the link member of FIG. 13.

DETAILED DESCRIPTION OF THE PREFERRED EMBODIMENTS

Using the spacers and link members to be described a three dimensional electrical circuit can be built in which the components are mounted on chip carriers. The carriers generally only carry a single semiconductor chip though this may itself be a very large and complex circuit, as when the chip is a wafer.

Figure 1:
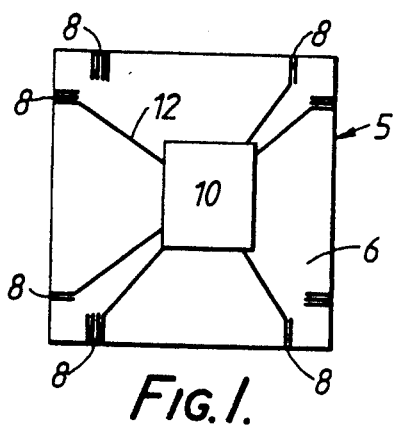
FIG. 1 is a plan view of a chip carrier suitable for use with the spacers of the present invention for constructing a large scale electrical circuit.
Figure 2:
FIG. 2 is a side view of the chip carrier of FIG. 1.

FIGS. 1 and 2 show a typical chip carrier. As shown, the chip carrier 5 comprises a slab of electrically insulating material 6 of almost square configuration having contact pads 8 (only some of which are shown) equally spaced along all four sides of the upper surface (visible in FIG. 1) and also along all four sides of the undersurface. Contact pads may also be formed along he edges of the material. The contact pads 8 are preferably formed by a metal plating process. The contact pads 8 on the upper side of the material 6 are electrically separate from those on the underside and from any on the edges. However, in some applications two or more pads 8 may be connected together.

The chip carrier carries a semiconductor chip 10 which is secured in position on the insulating material 6 and is electrically connected to certain of the contact pads 8 by means of connections 12 which may, for example, be printed-circuit-type connections or may be wire-type connections. The chip 10 is also connected to some of the contact pads 8 on the underside or edges of the material 6 by means of further connections similar to the connections 12, these connections connecting to the chip 10 through the material 6 such as by means of plated-through holes for example. The carrier may also have a stepped structure allowing connections to the chip lo be made to different levels of the carrier. Such a stepped structure carrier is described in GB-B-2 127 217.

FIGS. 3 to 6 show a spacer 20 which is used to produce a stack of chip carriers. A similar spacer for producing a power and signal transmission stack will be described later with reference to FIG. 8.

The spacer 20 is moulded from electrically insulating plastics material and is a generally frame-shaped member defining a nearly square aperture 22. The frame-shape is made up of four corners 24, 26, 28 and 30 between which integral side portions 32, 34, 36 and 38 extend Each side portion 32, 34, 36 and 38 comprises a rectangular strut 40 see the sectional view in FIG. 6) along which are arranged integrally moulded and equally spaced fins 42. As is apparent from FIG. 6 the upper and lower surfaces of the struts 40 are not completely flat but each have a V-shaped channel 44 for a purpose to be described.

The fins 42 define slots 48 running along all four sides 32, 34, 36 and 38. Respective electrical contact clips 50 (FIG. 6), made of suitable springy electrically conductive material, are fitted into each of the slots 48. Each clip has two facing inwardly bent portions 46, which engage in the V-shaped channels 44 when the clip is fitted over the strut 40 in a slot 48, in order to retain the clip in position The free ends of the clip project away from the spacer on either side in order to make good electrical contact with contact pads on a chip carrier clamped against the surface of the strut.

Figure 3:
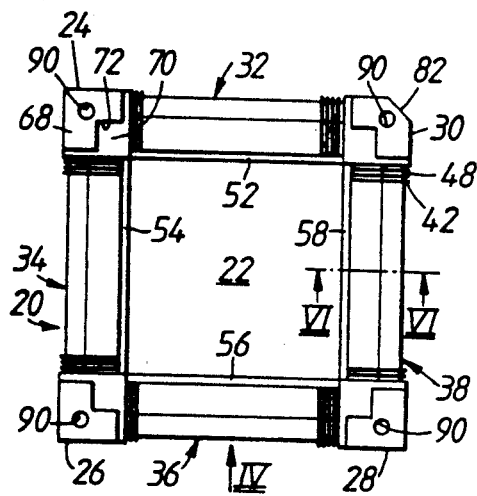
FIG. 3 is a plan view of a spacer for use with chip carriers.
Figure 5:
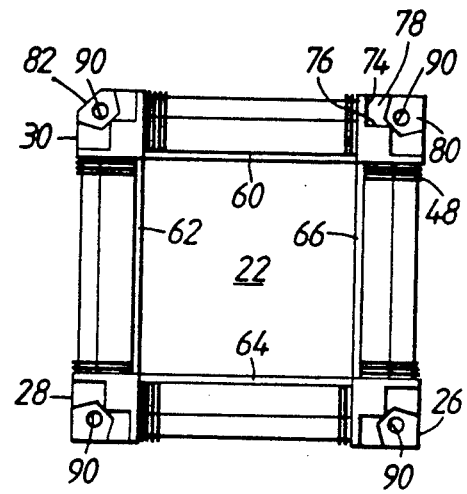
FIG. 5 is an underside view of the spacer of FIGS. 3 and 4.

The inward edges of the fins 42 define recesses 52, 54, 56 and 58 running longitudinally around the four sides of the opening 22 on the top side of the spacer as viewed in FIG. 3 and corresponding recesses 60, 62, 64 and 66 running along the four sides of the opening 22 on the underside of the spacer as viewed in FIG. 5.

Each corner 24, 26 and 28 is of the same shape. As shown for corner 24, there is an upstanding part 68 on a base 70, the latter being flush with the top surface of the fins 42. The upstanding part 68 has a cut-out 72.

Figure 4:
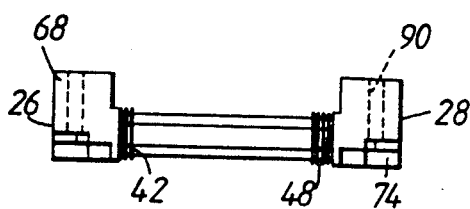
FIG. 4 is a view locking in the direction of the arrow IV of FIG. 3.
Figure 6:
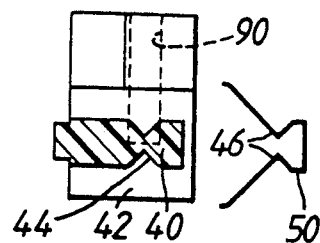
FIG. 6 is a section on the line VI-VI of FIG. 3 showing a contact clip for use with the spacer.

As shown in FIGS. 4 and 5, the underside of the corner 24 has a recess 74 with a re-entrant part 76 matching the cut-out 72 (FIG. 3). The recess 74 is defined by a surface 78 which is itself further recessed, as shown at 80 in FIG. 5.

The corner 30 of the spacer is identical in form to the corners 24, 26 and 28 except that it does not have a reatangular external form but is diagonally cut across as indicated at 82.

A plurality of the spacers 20 and a corresponding plurality of the chip carriers 5 (FIGS. 1 and 2) are used to form a stack which defines part of an electronic circuit. Thus, a respective chip carrier 5 is placed into each spacer so that the four corners of the chip carrier lie respectively in the cut-outs 72 at the corners of the spacer (FIG. 3). The positions of the cut-outs 72 in the spacer are arranged to correspond exactly to the shape of the insulating slab of the carrier. Ideally the carrier and spacer are so shaped that the carrier will fit into the spacer in only two orientations 180° displaced from each other. For correct orientation the corner of the carrier intended to be aligned with corner 30 may be provided with an appropriate mark. Other mechanisms may be employed to ensure correct orientation.

Figure 7:
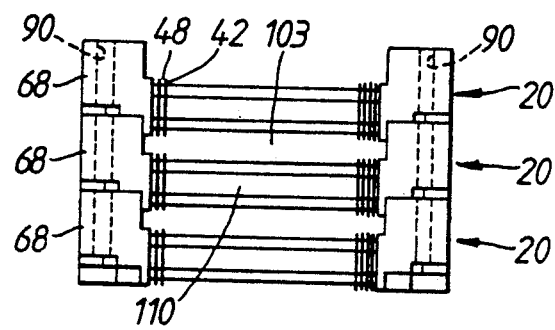
FIG. 7 is a side view showing a stack of chip carrier spacers.

When a chip carrier has been placed into position on a spacer, the spacers, with the chip carriers, are then snapped together as shown diagrammatically in FIG. 7 so as to form a stack, in which the re-entrant part 76 engages with the cut-out 72 of the next spacer at each corner. It will thus be seen that each contact 50 (see FIG. 6), when fitted within its respective slot 48 in a spacer, makes electrical contact between a particular one of the contact pads 8 (see FIG. 1) on the undersurface of the chip carrier immediately above it and a respective one of the contact pads 8 on the upper surface of the chip carrier immediately below it.

The resultant stack is rigidly clamped together by means of tie bars which extend through all the spacers of the stack via holes 90 (see FIGS. 3 to 6) positioned at the four corners of the spacers. The opposite ends of each tie rod are screw-threaded to receive nuts by means of which the whole assembly is firmly clamped together to maintain the necessary electrical contacts, even in the face of considerable mechanical shock or vibration. The recesses 80 (FIG. 5) are shaped to match the shape of the nuts so as to hold them against rotation.

From FIG. 7, it will be appreciated that in a stack of spacers a series of apertures 103 is defined along each of the side faces of the stack. Each aperture 103 has its edges defined by the upper surface of a strut of the lower spacer, and the lower surface of the corresponding strut of the upper spacer. Where a chip carrier is clamped between the two spacers its contact pad bearing edge is engaged between the edges of the aperture. If external power or signal connections are to be made to the stack, either from an adjacent chip carrier stack or from a power and signal transmission stack, no chip carrier is provided between two adjacent spacers so that the apertures on each face of the stack between these two adjacent spacers are available so that electrical connection means provided on link members can be inserted into any of the four apertures to provide connections, via the contact clips 50, to chip carriers above and below the aperture. Such a pair of spacers without chip carriers clamped between them will be referred to herein as an 'empty level'. Various possible designs for link members will be described later with reference to FIGS. 10–14.

From the foregoing, it will be seen that the contact pads 8 of the chip carriers and the electrical connection means of any link members are electrically connected together via the contact clips 50 on the spacers, there thus being a plurality of electrical connections up each side of the stack. Within this stack an electrical connection can be made between any two contact pads 8 on chip carriers within the stack by routing the connection appropriately through the clips 50 and by connections between pads on opposite sides of the same chip carrier.

Figure 8:
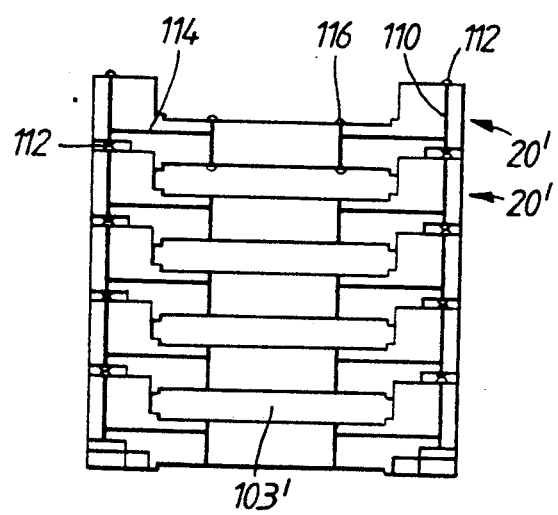
FIG. 8 is a side view of a stack of spacers for conducting power and signals.

FIG. 8 shows a stack of spacers 20' for forming a power and signal transmission stack. These spacers are essentially similar to the spacers described for making stacks of chip carriers. However, they may be of smaller dimensions since they are required to produce fewer electrical connections. The spacers 20' are described as rectangular frame-shaped members. However, because they are not required to clamp carriers between them, these spacers could also be formed as just a single side portion with two end portions formed in the same manner as the corners of the already described spacer 20, for interlocking the spacers together in a stack.

Each of the spacers 20' has a track section 110 which extends down the whole of the depth of the corner and connects to contact pads 112 formed on the upper surface of the upstanding part 68 of the corner and on the surface 74 of the underside of the corner so that the pads 112 make electrical contact when the two spacers 20' are snapped together.

A tapping conductor 114 extends from each track section 110 to contacts 116 on the upper and lower surface of the adjacent strut. The tapping conductors 114 and track sections 110 may be conductive tracks deposited on the surface of the underlying insulating frame member of the spacer 20' or may be, at least partly, defined by clip members. For a four-sided spacer 20' with a track section 110 formed on each face of each corner, it is possible to define eight independent continuous tracks extending the length of a power and signal transmission stack. Such a stack may be produced to any height and, by ensuring that the height of each spacer 20' is identical to the height of each spacer 20, the pitch of the apertures 103' defined in each face of such a power and signal transmission stack between adjacent spacers 20', is identical to the pitch of the apertures 103 in a chip carrying stack. If the power and signal transmission stack is mounted on a printed circuit board, then power or signals may be fed to the stack via direct contacts from the board to the contact pad 112 on the underside of the lower most spacer 20' of the stack. However, power and signals are preferably input and output from the stack via electrical connection means of link members Such electrical connection means can be inserted into any aperture and have contacts on one or both sides in order to engage with the contacts 116 at the edges of the aperture.

Although the power and transmission stack has been describe as being constructed from spacers, it would also be possible to mould a complete stack as a one piece plastics tower. In this case, the apertures would be produced in the tower as sockets at the required pitch. In another variation, the tie bars used to clamp all the spacers of the stack together via holes 90' may provide the continuous track extending the length of the stack. In this case, each portion of the tie bar may be regarded as a track section. In this type of embodiment the tapping conductor may include a tab integrally moulded into the body of the spacer to surround the hole 90 so that when the tie bar is inserted into the hole it makes goods electrical contact with the proJecting portions of the tab. With this type of stack, it is, of course, only possible to incorporate four continuous tracks in each rectangular plan stack.

Figure 9:
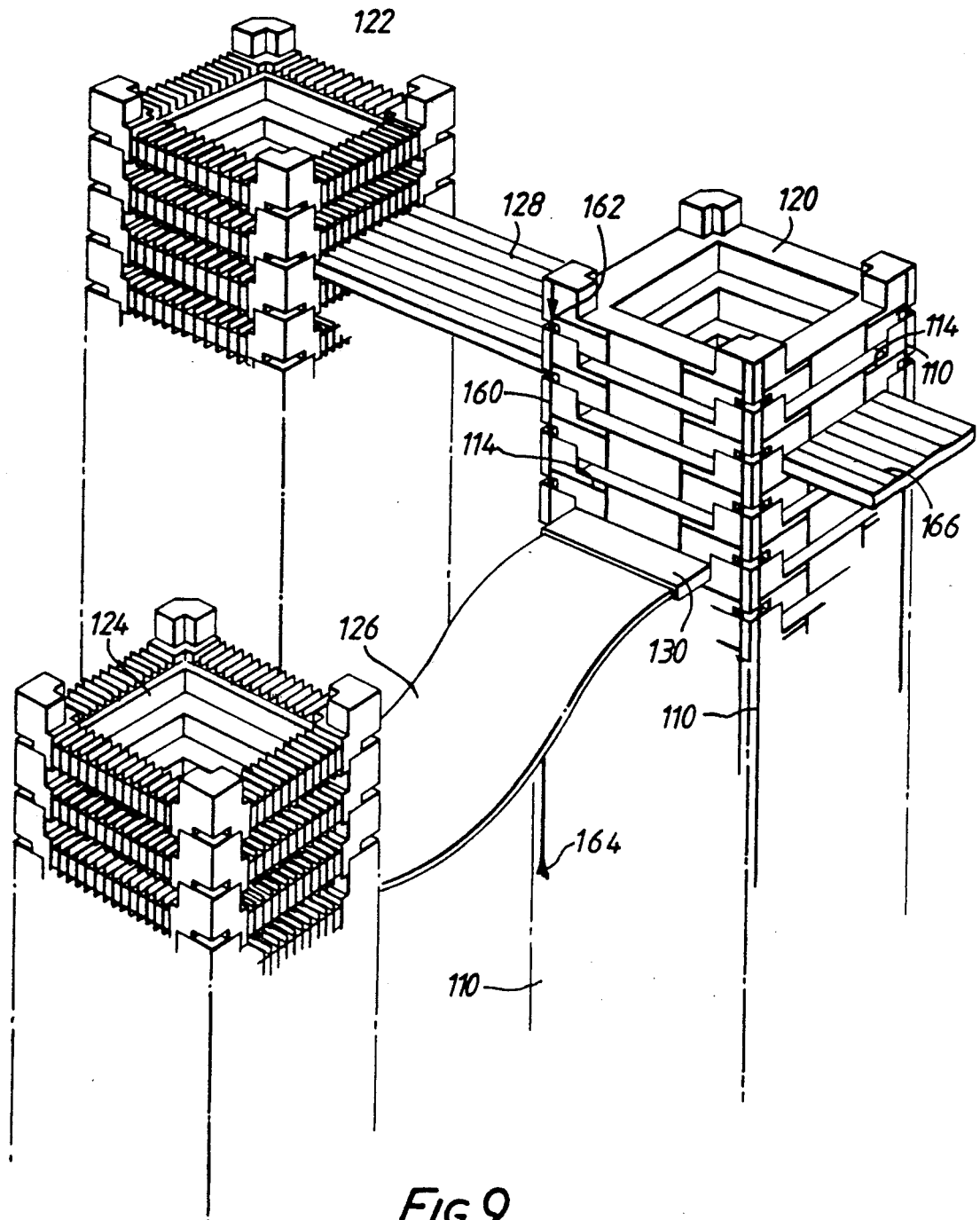
FIG. 9 is a perspective view of part of an electrical circuit showing how stacks of spacers can be interconnected in order to provide a three dimensional electrical circuit.

FIG. 9 illustrates a portion of a three dimensional electrical circuit than can be built up using the spacers described. Only three stacks 120, 122, 124 are illustrated. However, depending on the size of the circuit, any number of stacks may be used. The stacks are preferably arranged in plan as a rectangular array of rows and columns. Any of the stacks may be power and signal transmission stack or chip carrier stacks depending on the application of the circuit. In an embodiment in which the stacks are arranged in a rectangular array of rows and columns, if every fourth stack in each row is a power and signal transmission stack, with the positions of the power and signal transmission stacks in adjacent rows being staggered relative to one another, each chip carrier stack can be served by an adjacent power and signal transmission stack. However, other configurations are possible since link members may pass through opposite apertures at an empty level in a chip carrier stack in order to deliver power or signals to a stack on the other side. It will be appreciated that it is necessary to provide an empty level in a chip carrier stack wherever electrical connection means are to be inserted in the stack. This can be avoided for some types of link member for use with modified chip carriers as shown in FIG. 12.

Let us suppose that in FIG. 9, stack 120 is a power and signal transmission stack. Connections from this stack to the adjacent chip carrying stacks 122 and 124 are made via link members 126, 128. These link members may be flexible as shown a 126, in which case the electrical connection means 130 at each end of the link member may be connected to apertures at different levels in the two connected stacks. In the case of a rigid link member as shown at 128, power and signals may only be passed across between the stacks at the same level. A rigid link member 128 may pass through empty levels in a number of chip carrier stacks and through power and signal transmission stacks. In this way an array of stacks is mechanically supported by rigid link members extending perpendicularly to one another throughout the array of stacks at various levels. This avoids the need for the stacks to be supported on a base plane and allows them to be of different lengths and terminate in different planes.

Link members for connecting stacks will now be described.

One type of flexible link member is shown in FIGS. 10 and 11. As shown, this comprises electrical connection means at each end which are in the form of rectangular contact supports 100 and 102 of electrically insulating material on each of whose upper and lower surfaces are formed (as by plating) contact pads 104. The contact pads 104 on the upper surfaces of the contact supports are connected together by flexible electrical connections 106, while the contact pads 104 on the lower surfaces of the contact supports are connected together by flexible electrical connections 108. The contact supports 100 and 102 are sized so as to fit into the apertures 103 and 103' between adjacent spacers 20 or 20' in a stack The contact pads 104 are correctly spaced so as to make respective electrical connections with the contacts 50 on the edges of an aperture 103 in a chip carrier stack, or so as to make connections with the contacts 116 on the edges of an aperture 103' in a power and signal transmission stack. This contact support requires an empty level in the chip carrier stack.

FIG. 12 illustrates a modified type of chip carrier which may be used to avoid the need to provide an empty level in a chip carrier stack. This modified chip carrier 150 has corners 152 which are dimensioned to be received within the cut outs 72 at each corner of the spacer 20. Between these corners 152 the chip carrier has extensions adapted to project outwardly from the apertures 103 of the stack. The usual contact pads 8 are provided at the normal periphery of the chip carrier with further contact pads 154 formed on the edges of the extensions so as to make contact with an edge connector 156 providing the electrical connection means of a rigid or flexible link member 158.

FIGS. 13 and 14 show a typical rigid link member. This link member may be sized to traverse a large number of stacks or may simply be long enough to span the gap between facing apertures on adjacent stacks. This link member is a rigid insulating board 132 which has a number of tracks 134 defined across its surface or through the body of the member. At each end electrical connection means are defined on a reduced thickness portion 136. As shown on the left hand end in FIGS. 13 and 14, these electrical connection means are merely extensions of the tracks 134 which make direct contact with contact clips 50 when the end portion 136 is inserted between the edges of an aperture in a chip carrier stack. On the right hand side as shown in FIGS. 13 and 14, a V-shaped channel 140 is formed on both surfaces of the portion 136 in order that a contact clip 138 may be retained on the edge portion. Fins 144 may be formed on this portion 136 so as to define slots to correctly locate the contact clips 138. It will be appreciated that this arrangement is similar to the arrangement of contact clips 50 in slots 48 defined on the struts 40 of a spacer 20 as previously described. The tracks 134 terminate in the base of the V-shaped channel 140 to make good electrical contact with the inwardly bent portions of the clip 138 which engage in the channel. This latter type of electrical connection means with contact clips 138 is particularly suitable for engagement with an aperture 103' of a power and signal transmission stack which has contacts 116 which are pads formed directly on the surface of the aperture edges.

As well as electrical connection means at each end of the link member, electrical connections may be made at intermediate points on the link member if it passes through an empty level in a chip carrying stack or through opposite faces of a power and signal transmission stack. In order to provide the required electrical connections, it may be necessary to bend the tracks 134 into an appropriate configuration to make contact at the required point.

Many modifications may be made to the assembly illustrated. In particular, the spacers may have different forms and shapes. It is not necessary for the spacers to be four-sided. An advantageous shape for the spacers is hexagonal, so that they can be used with hexagonally shaped chip carriers carrying circular wafers. In such a case, a stack of the spacers could be assembled together using tie rods as described. Six tie rods could be used, spaced at the six corners of the hexagon. However, in certain applications less than six tie rods might be sufficient.

The use of tie rods and nuts for holding the stacks together is particularly advantageous because it provides a very firm assembly well able to withstand shock and vibration However, other arrangements are possible The dimensions of the cut-out and re-entrant may be such as to provide a positive holding action sufficient in itself to hold the carriers together. Alternatively, the spacers could be provided with built-in clips, such as moulded-on clips, by means of which each one could be clipped to the adjacent spacers in the stack. Alternatively, separate and externally applied clips could be used.

An electrical circuit can be built up using the stacks described and may be tested before the engaging contacts are finally vapour-phase soldered together in order to define a permanent circuit. Until this stage, it will be appreciated that it is possible to dis-assemble the stacks and replace chip carriers with relative ease.

It will be appreciated that it is possible to force cooling air through an array of such stacks as described. However, cooling problems may be associated with high density chip carrier stacks. In order to avoid this problem, it is proposed that the spacers 20 for fabricating such chip carrier stacks, or sections of them, may be made of materials, for example polystyrene or acrylic which can be subsequently dissolved once the circuit has been finally vapour-phase soldered together. The stack of chip carriers will then be retained together by means of the skeleton of contact clips 50. Such a skeleton arrangement allows a free flow of cooling medium over the chip carriers.

It will be appreciated that if electrical connection means are provided by optical fibres, the contacts will need to be replaced by appropriate light coupling means. Assuming the chips mounted on the chip carriers require electrical current signals, an interface, such as a photocell, to convert the light signals into electrical currents will also be needed.

It will be appreciated that if the electrical connection means described are to be, in whole or in part, an optical system, the contact system described will need to be replaced, in whole or in part, with an optical connection system. Such a modification is desirable in the case where the interconnection system is required to handle very high frequency communications traffic. Optical emitters (e g. laser diodes) may be formed as part of the semiconductors mounted onto the carriers or may be driven by circuitry within a stack. Optical detectors (e g, photodiodes) may also be formed or driven in the same manner. Optical fibres to permit the two to communicate may be routed through holes formed in the spacers or routed as continuous paths along the outer surface of chip carrier stacks, power and signal transmission stacks or link members. For example the continuous track made up of sections 110 may be a single optical fibre 160 (FIG. 9) applied after assembly of the stack and co-operating with an emitter 162 and a detector 164 integrally formed with the tapping conductors on specially modified spacers. Similarily one of the tracks on the link member 128 may be an optical fibre 166.

It will be appreciated that the combination of spacers 20, 20' and appropriate link members either flexible, rigid or both, allows chip carriers to be assembled together in a great number of different interconnection patterns. This allows extremely complex circuits to be built up in practice. The necessary routing between contacts of each individual chip can be determined using a computer-aided design system in order to maximise the efficiency of signal routing. As compared with the building up of complex circuits on a racked series of circuit boards, the present invention provides considerably fewer limitations on design and makes possible far shorter signal paths.

What we claim is:

1. An interconnection system for interconnecting two-sided chip carriers comprising one or more interconnection units, at least one of the interconnection units comprising, a plurality of mechanically interlocking spacer elements arranged in a stack, each of at least some of said spacer elements including at least one elongate support member having an upper surface, for supporting a chip carrier, a lower surface and side surfaces, one or more chip carriers, each chip carrier being mounted on at least one of said support members of a spacer element, a plurality of electrically conductive contact clips distributed along the support member in spaced relationship with one another, each contact clip comprising a first part, a second part, and third part uniting the first and second parts, location means on the support member for locating each said contact clip at a respective position on the support member, the contact clip embracing the support member so that the first and second parts thereof are disposed adjacent the said upper and lower surfaces respectively of the support member, wherein the said upper and lower surfaces of immediately adjacent support members in the stack define a respective aperture in the stack enabling an external electrical connection to be made to one or more of the contact clips disposed adjacent to said upper and lower surfaces, and said first part of each contact clip is capable of establishing an electrical connection with a respective contact pad on the lower surface of a chip carrier supported by said support member, and said second part of each contact clip is capable of establishing an electrical connection with a respective contact pad on the upper surface of a chip carrier supported by a support member of an immediately underlying spacer element in the stack so that said contact pads are connected together electrically via said first, second and third parts of the contact chip, wherein at least one of the chip carriers carries optical emitters and/or detectors for cooperation with optical fibres.

2. An interconnection system according to claim 1, wherein:
   at least one of said interconnection units includes one or more continuous optical paths extending between a plurality of spacer elements in the stack.

3. An interconnection system according to claim 2, wherein:
   said optical paths comprise optical fibres routed through holes in the spacer elements.

4. An interconnection system according to claim 2, wherein:
   said optical paths comprise optical fibres routed along the outer surface of the stack.

5. An interconnection system according to claim 1, comprising at least two interconnection units and at least one link member providing an electrical connection between said interconnection units, wherein said at least one link members includes an optical fibre providing optical connection between said interconnection units.

* * * * *